United States Patent
Nakamura

(10) Patent No.: US 11,600,513 B2
(45) Date of Patent: Mar. 7, 2023

(54) PROCESSING METHOD OF WAFER

(71) Applicant: DISCO CORPORATION, Tokyo (JP)

(72) Inventor: Masaru Nakamura, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 77 days.

(21) Appl. No.: 17/221,082

(22) Filed: Apr. 2, 2021

(65) Prior Publication Data
US 2021/0335667 A1 Oct. 28, 2021

(30) Foreign Application Priority Data
Apr. 28, 2020 (JP) .............................. JP2020-079099

(51) Int. Cl.
| | |
|---|---|
| *H01L 21/683* | (2006.01) |
| *H01L 21/768* | (2006.01) |
| *H01L 21/48* | (2006.01) |
| *H01L 21/56* | (2006.01) |
| *H01L 21/02* | (2006.01) |
| *H01L 21/78* | (2006.01) |

(52) U.S. Cl.
CPC .... *H01L 21/6836* (2013.01); *H01L 21/02076* (2013.01); *H01L 21/4821* (2013.01); *H01L 21/561* (2013.01); *H01L 21/76894* (2013.01); *H01L 21/78* (2013.01); *H01L 2221/68327* (2013.01)

(58) Field of Classification Search
CPC ......... H01L 21/78–786; H01L 21/6836; H01L 21/4821; H01L 21/6835; H01L 2221/6834; H01L 2221/68327; H01L 2221/68336; B28D 5/00–0047; B28D 5/0052
See application file for complete search history.

(56) References Cited

U.S. PATENT DOCUMENTS

| | | | | |
|---|---|---|---|---|
| 9,640,420 B2* | 5/2017 | Nakamura | .............. | H01L 21/78 |
| 9,748,182 B2* | 8/2017 | Nakamura | .............. | H01L 22/30 |
| 2016/0172312 A1* | 6/2016 | Nakamura | .......... | H01L 21/6836 |
| | | | | 438/462 |

FOREIGN PATENT DOCUMENTS

JP     2012002604 A     1/2012

* cited by examiner

*Primary Examiner* — Jose R Diaz
(74) *Attorney, Agent, or Firm* — Greer, Burns & Crain, Ltd.

(57) ABSTRACT

A processing method of a wafer includes a modified layer forming step of positioning the focal point of a laser beam with a wavelength having transmissibility with respect to the wafer to the inside of a planned dividing line and executing irradiation along the planned dividing line to form modified layers inside and a water-soluble resin coating step of coating the front surface of the wafer with a water-soluble resin before or after the modified layer forming step. The processing method also includes a dividing step of expanding a dicing tape to divide the wafer into individual device chips together with the water-soluble resin with which the front surface of the wafer is coated and a modified layer removal step of executing plasma etching and removing the modified layers that remain at the side surfaces of the device chips in a state in which the dicing tape is expanded and the front surfaces of the individual device chips are coated with the water-soluble resin.

9 Claims, 4 Drawing Sheets

PROCESSING METHOD OF WAFER

BACKGROUND OF THE INVENTION

Field of the Invention

The present invention relates to a processing method of a wafer for dividing, into individual device chips, the wafer on which plural devices are formed on a front surface in such a manner as to be marked out by plural planned dividing lines that intersect each other.

Description of the Related Art

A wafer on which plural devices such as integrated circuits (ICs), large-scale integration (LSI) circuits, and light emitting diodes (LEDs) are formed on a front surface in such a manner as to be marked out by plural planned dividing lines that intersect each other is divided into individual device chips by a laser processing apparatus, and the device chips obtained by the dividing are used for electrical equipment such as mobile phones and personal computers.

The laser processing apparatus includes a chuck table that holds a workpiece (wafer), a laser beam irradiation unit that irradiates the workpiece held by the chuck table with a laser beam with a wavelength having transmissibility with respect to the workpiece, an X-axis feed mechanism that executes processing feed of the chuck table and the laser beam irradiation unit relatively in an X-axis direction, and a Y-axis feed mechanism that executes processing feed of the chuck table and the laser beam irradiation unit relatively in a Y-axis direction orthogonal to the X-axis direction. The laser processing apparatus positions the focal point of the laser beam to the inside of a planned dividing line of the wafer and executes irradiation to form modified layers that serve as the points of origin of dividing inside the planned dividing lines (for example, refer to Japanese Patent Laid-open No. 2012-2604). Then, a tape that supports the back surface of the wafer is expanded and the wafer is divided into the individual device chips with use of the modified layers formed inside along the planned dividing line as the points of origin of the dividing.

SUMMARY OF THE INVENTION

In the case in which modified layers that serve as the points of origin of dividing are formed along planned dividing lines and a wafer is divided into individual device chips as described above, there is a problem that, when the wafer is divided, dust is scattered from the parts that have served as the points of origin of dividing and adheres to the front surface of devices to contaminate the devices.

Further, part of the modified layers remains at the outer circumferences (sidewalls) of the device chips. Therefore, there are problems that dust is scattered from the remaining modified layers to contaminate the device chips and the atmosphere also in steps subsequent to the dividing step, and that the flexural strength of the device chips is lowered due to the remaining of the modified layers at the sidewalls of the device chips.

Thus, an object of the present invention is to provide a processing method of a wafer in which the front surface of device chips and the atmosphere are not contaminated and the flexural strength of the device chips is not lowered.

In accordance with an aspect of the present invention, there is provided a processing method of a wafer for dividing, into individual device chips, the wafer on which a plurality of devices are formed on a front surface in such a manner as to be marked out by a plurality of planned dividing lines that intersect each other. The processing method includes a modified layer forming step of positioning a focal point of a laser beam with a wavelength having transmissibility with respect to the wafer to an inside of the planned dividing line and executing irradiation with the laser beam along the planned dividing line to form modified layers inside and a water-soluble resin coating step of coating the front surface of the wafer with a water-soluble resin, before or after the modified layer forming step. The processing method includes also a frame supporting step of sticking a back surface of the wafer to a dicing tape and supporting an outer circumference of the dicing tape by a ring frame having an opening part that houses the wafer, before or after the modified layer forming step, and a dividing step of expanding the dicing tape to divide the wafer into the individual device chips together with the water-soluble resin with which the front surface of the wafer is coated. The processing method includes also a modified layer removal step of executing plasma etching and removing the modified layers that remain at side surfaces of the device chips in a state in which the dicing tape is expanded and front surfaces of the individual device chips are coated with the water-soluble resin and a water-soluble resin removal step of removing the water-soluble resin with which the front surfaces of the device chips are coated.

In a case in which the frame supporting step is executed after the modified layer forming step, irradiation with the laser beam can be executed from a back surface side of the wafer to form the modified layers inside the planned dividing lines in the modified layer forming step. Further, in a case in which the frame supporting step is executed before the modified layer forming step, irradiation with the laser beam can be executed from a side of the dicing tape through the dicing tape to form the modified layers inside the planned dividing lines in the modified layer forming step.

Preferably, in the dividing step, the water-soluble resin is heated and softened in a case in which the dicing tape is expanded to divide the wafer into the individual device chips after the water-soluble resin solidifies. Preferably, in the dividing step, the dicing tape is expanded to divide the wafer into the individual device chips before the water-soluble resin solidifies.

According to the processing method of a wafer in accordance with the present invention, even if dust is scattered when the wafer is divided, the front surface of the wafer is shielded from the dust by the water-soluble resin, and the problem that the device chips are contaminated is solved. Further, the plasma etching is executed in the state in which the front surfaces of the device chips are protected by the water-soluble resin. Therefore, the modified layers that remain at the outer circumferences of the device chips are removed without giving damage to the device chips, and dust is not scattered in the subsequent steps. Thus, the problem that the device chips and the atmosphere are contaminated is solved. In addition, the problem that the flexural strength of the device chips lowers is also solved.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Figure 1:
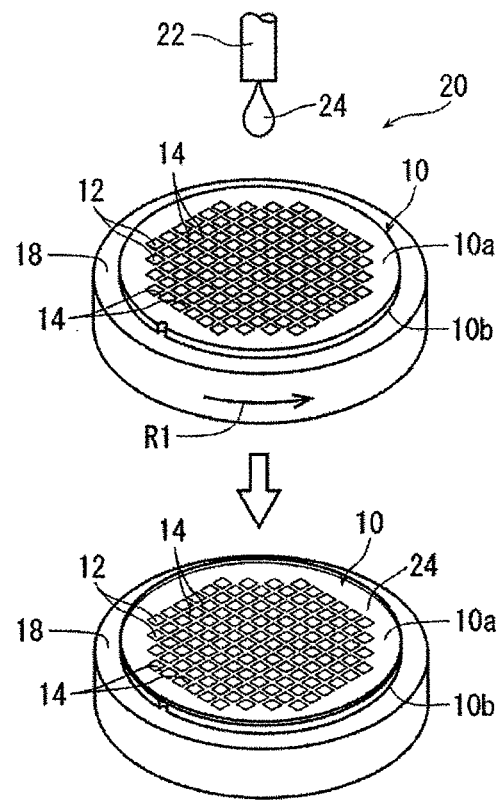
FIG. 1 is a perspective view illustrating an execution form of a water-soluble resin coating step.

A processing method of a wafer according to an embodiment of the present invention will be described in detail below with reference to the accompanying drawings. In FIG. 1, a wafer 10 that is a workpiece processed by the processing method of a wafer according to the present embodiment is illustrated. The wafer 10 is a wafer that contains silicon, sapphire, gallium arsenide, or the like as a substrate and has a circular disc shape, and plural devices 12 are formed on a front surface 10a in such a manner as to be marked out by plural planned dividing lines 14 that intersect each other. The wafer 10 prepared in this manner is conveyed to a water-soluble resin coating apparatus 20 (only partly illustrated) illustrated in FIG. 1 and is placed and held on a spinner table 18 with the side of a back surface 10b oriented downward. The spinner table 18 includes a rotational drive unit that is not illustrated in the diagram and the spinner table 18 is rotated at high speed.

In the water-soluble resin coating apparatus 20, a nozzle 22 that supplies a predetermined water-soluble resin 24 downward is disposed. The water-soluble resin 24 supplied from the nozzle 22 is a water-soluble liquid resin such as polyvinyl alcohol (PVA) or polyvinylpyrrolidone (PVP), for example.

The above-described nozzle 22 is positioned above the center of the spinner table 18, i.e., the center of the front surface 10a of the wafer 10, and a predetermined amount of the water-soluble resin 24 is supplied downward. In addition, the spinner table 18 is rotated in a direction depicted by R1 at, for example, 300 rpm. The water-soluble resin 24 is spread to the outer circumferential side of the front surface 10a of the wafer 10 by a centrifugal force generated due to this rotation, and the whole of the front surface 10a of the wafer 10 is coated with the water-soluble resin 24 as illustrated on the lower stage of FIG. 1 (water-soluble resin coating step). As described later, the water-soluble resin coating step is not limited to the execution at this timing and may be executed after a modified layer forming step to be described later is executed, and it suffices that the water-soluble resin coating step is executed by the time a dividing step is executed.

Figure 2:
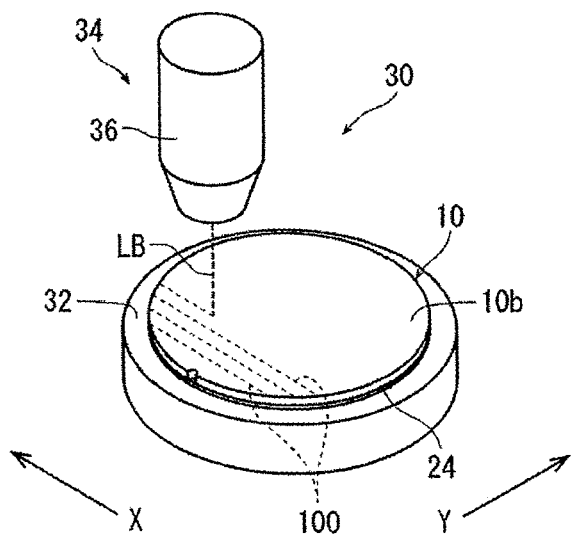
FIG. 2 is a perspective view illustrating an execution form of a modified layer forming step.

Subsequently, the wafer 10 is conveyed to a laser processing apparatus 30 (only partly illustrated) illustrated in FIG. 2. The laser processing apparatus 30 includes a holding unit including a chuck table 32 and a laser beam irradiation unit 34 that irradiates the wafer 10 held by the chuck table 32 with a laser beam LB. Further, the upper surface of the chuck table 32 is formed of a material having gas permeability and is connected to a suction source that is not illustrated in the diagram through the inside of the chuck table 32. The laser processing apparatus 30 includes an X-axis feed mechanism that executes processing feed of the chuck table 32 and the laser beam irradiation unit 34 relatively in an X-axis direction, a Y-axis feed mechanism that executes indexing feed of the chuck table 32 and the laser beam irradiation unit 34 relatively in a Y-axis direction orthogonal to the X-axis direction, and a rotational drive unit that rotates the chuck table 32 (diagrammatic representation is omitted regarding all of them).

The wafer 10 conveyed to the laser processing apparatus 30 is placed on the upper surface of the chuck table 32 and is sucked and held with the side of the back surface 10b oriented upward. The water-soluble resin 24 solidifies over time and no trouble is caused even when the wafer 10 is held by the chuck table 32. For the wafer 10 held by the chuck table 32, an alignment step with use of an infrared irradiation unit disposed in the laser processing apparatus 30 and an alignment unit including an infrared camera (diagrammatic representation is omitted) is executed. Thereby, the position of the planned dividing line 14 formed in a predetermined direction of the front surface 10a is detected, and the planned dividing line 14 is aligned with the X-axis direction. Information regarding the position of the detected planned dividing line 14 is stored in a control unit that is not illustrated in the diagram.

A beam condenser 36 of the laser beam irradiation unit 34 is positioned to the processing start position of the predetermined planned dividing line 14 on the basis of the position information detected by the above-described alignment step, and the focal point of the laser beam LB is positioned to the inside of the planned dividing line 14 that extends in a first direction of the wafer 10 and irradiation is executed. In addition, processing feed of the chuck table 32 is executed in the X-axis direction, and a modified layer 100 is formed inside the planned dividing line 14 of the wafer 10. After the modified layer 100 has been formed along the inside of the predetermined planned dividing line 14 that extends in the first direction, indexing feed of the chuck table 32 is executed in the Y-axis direction by the interval of the planned dividing lines 14, and the planned dividing line 14 that is adjacent in the Y-axis direction and has not yet been processed is positioned directly under the beam condenser 36. Then, similarly to the above-described process, the focal point of the laser beam LB is positioned to the inside of the planned dividing line 14 of the wafer 10 and irradiation is executed, and processing feed of the chuck table 32 is executed in the X-axis direction to form the modified layer 100 inside.

Similarly, processing feed of the chuck table 32 is executed in the X-axis direction and indexing feed of the chuck table 32 is executed in the Y-axis direction to form the modified layers 100 inside all planned dividing lines 14 that extend in the first direction. Subsequently, the chuck table 32 is rotated by 90 degrees, and the planned dividing lines 14 of a second direction orthogonal to the planned dividing lines 14 that extend in the first direction are aligned with the X-axis direction. Then, also for the inside of each planned dividing line 14, the focal point of the laser beam LB is positioned to the inside and irradiation is executed similarly to the above-described process, so that the modified layers 100 are formed inside all planned dividing lines 14 formed in the front surface 10a of the wafer 10 (modified layer forming step).

Figure 3:
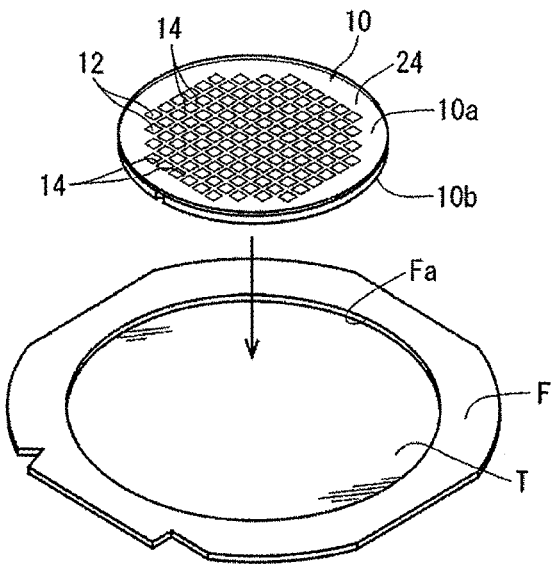
FIG. 3 is a perspective view illustrating an execution form of a frame supporting step.

The laser processing condition in the above-described modified layer forming step is set as follows, for example.
Wavelength: 1342 nm
Repetition frequency: 90 kHz
Average output power: 1.2 W
Processing feed rate: 700 mm/second After the modified layer forming step has been executed as described above, the wafer 10 is carried out from the laser processing apparatus 30. Then, the side of the front surface 10a coated with the water-soluble resin 24 is oriented upward, and the side of the back surface 10b is oriented downward and is stuck to the center of a dicing tape T illustrated in FIG. 3. In addition, the outer circumference of the dicing tape T is supported by a ring frame F having an opening part Fa with a size that allows housing of the wafer 10. Due to this, the wafer 10 is supported by the ring frame F through the dicing tape T (frame supporting step). The dicing tape T is a thin sheet that is composed of, for example, polyvinyl chloride (PVC) and has a surface on which a glue layer is formed and has expandability and contractibility.

Figure 4:
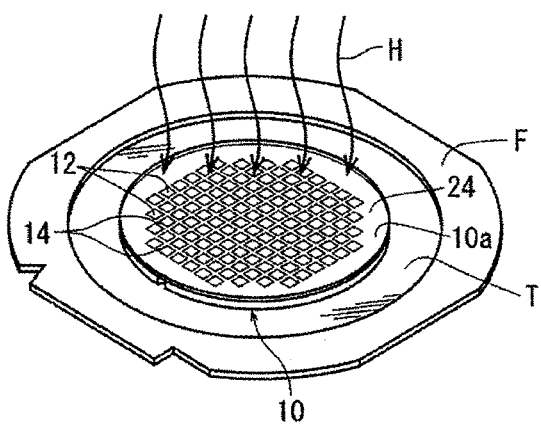
FIG. 4 is a perspective view illustrating a form of heating and softening a water-soluble resin.
Figure 5:
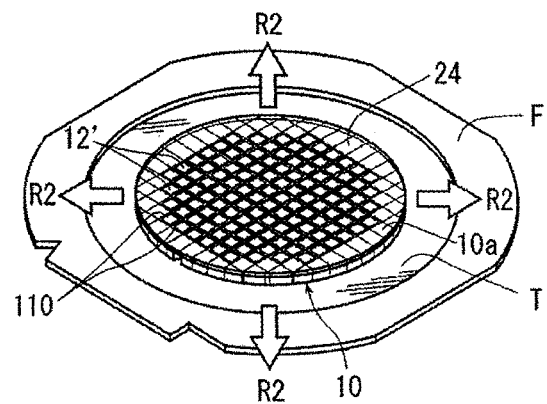
FIG. 5 is a perspective view illustrating an execution form of a dividing step.

After the wafer 10 has been supported by the ring frame F as described above, according to need, a heater (diagrammatic representation is omitted) is positioned above the front surface 10a coated with the water-soluble resin 24, and the water-soluble resin 24 is heated through application of hot air H thereto from the upper side as illustrated in FIG. 4 to soften the water-soluble resin 24. Subsequently, in the state in which the water-soluble resin 24 is softened, the wafer 10 is conveyed to an expanding apparatus that is not illustrated in the diagram and that expands the dicing tape T, and the dicing tape T is expanded in a radial manner (directions depicted by arrows R2) as illustrated in FIG. 5. Thereby, dividing grooves 110 are formed along the planned dividing lines 14 and the wafer 10 is divided into individual device chips 12' together with the water-soluble resin 24 with which the front surface 10a of the wafer 10 is coated (dividing step).

Figure 6:
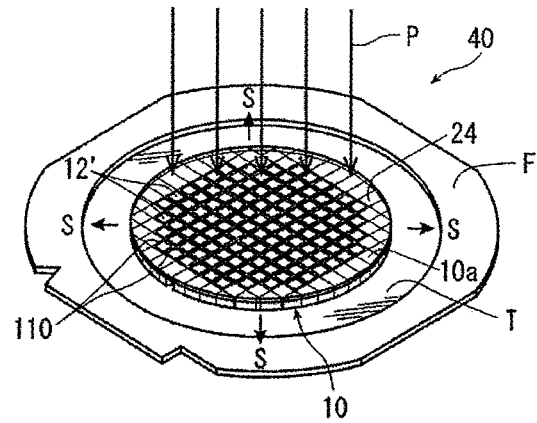
FIG. 6 is a perspective view illustrating an execution form of a modified layer removal step.

After the dividing step has been executed as described above, as illustrated in FIG. 6, the wafer 10 is conveyed, in a state in which the wafer 10 is supported by the ring frame F, to a plasma apparatus 40 regarding which detailed diagrammatic representation is omitted. A well-known plasma apparatus can be used as the plasma apparatus 40. For example, the plasma apparatus 40 includes an etching chamber that forms a sealed space, an upper electrode and a lower electrode that are disposed in the etching chamber, a gas supply unit that jets an etching gas from the upper electrode toward the lower electrode side in the etching chamber, and so forth (diagrammatic representation is omitted regarding all of them). Here, between the upper electrode and the lower electrode, the wafer 10 for which the dividing step has been executed is placed with the side of the front surface 10a oriented upward. Then, the etching gas is supplied into the etching chamber, and high-frequency power that generates plasma is applied to the upper electrode. Thereby, the etching gas turned to plasma is generated in the space between the upper electrode and the lower electrode, and etching gas turned to the plasma is drawn to the side of the wafer 10.

Here, the wafer 10 having conveyed to the plasma apparatus 40 through the above-described dividing step is kept in a state in which the side of the front surface 10a is protected by the water-soluble resin 24 and the adjacent device chips 12' are separated with the intermediary of the dividing groove 110, i.e., a state in which the sidewalls that form the outer circumferences of the device chips 12' are exposed. The state in which the sidewalls of the device chips 12' are exposed is implemented through execution of heating shrink processing in which heating treatment is executed on the outer circumferential region of the dicing tape T that supports the wafer 10 and a tensile force S is kept, for example. Due to this, in the above-described plasma apparatus 40, plasma etching is executed on the sidewalls of the device chips 12' in a state in which the front surface side of the individual device chips 12' is coated with the water-soluble resin 24. As a result, the modified layers that remain at the outer circumferences of the device chips 12' are removed without etching of the front surfaces of the device chips 12' (modified layer removal step).

Figure 7:
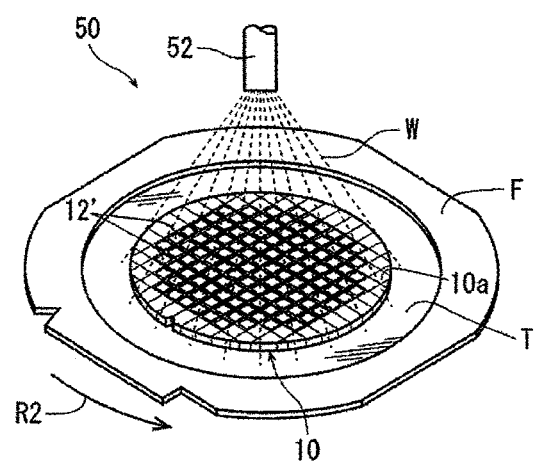
FIG. 7 is a perspective view illustrating an execution form of a water-soluble resin removal step.

Subsequently, the wafer 10 is held on a spinner table (diagrammatic representation is omitted) of a cleaning unit 50 (only partly illustrated) illustrated in FIG. 7 and is positioned directly under a water jet nozzle 52. Then, cleaning water W is jetted toward the front surface 10a of the wafer 10 while the spinner table is rotated in a direction depicted by the arrow R2 at, for example, 500 rpm. By the jetting of the cleaning water W, the film of the water-soluble resin 24 formed on the front surface 10a of the wafer 10 is dissolved and removed (water-soluble resin removal step). After the water-soluble resin 24 has been removed from the front surface 10a of the wafer 10, while the spinner table is rotated at, for example, 3000 rpm, air for drying is jetted from an appropriate air jet nozzle (diagrammatic representation is omitted) to dry the front surface 10a of the wafer 10.

According to the above-described embodiment, even if dust is scattered from the dividing grooves 110 when the wafer 10 is divided, the dust is blocked by the water-soluble resin 24 with which the front surfaces of the device chips 12' are coated and contamination is prevented. Further, the modified layers that remain at the outer circumferences of the device chips 12' are removed by the plasma etching, and therefore dust is not scattered in the subsequent steps. Thus, the problem that the device chips and the atmosphere are contaminated is solved. In addition, the problem that the flexural strength of the device chips is lowered is also solved.

Figure 8:
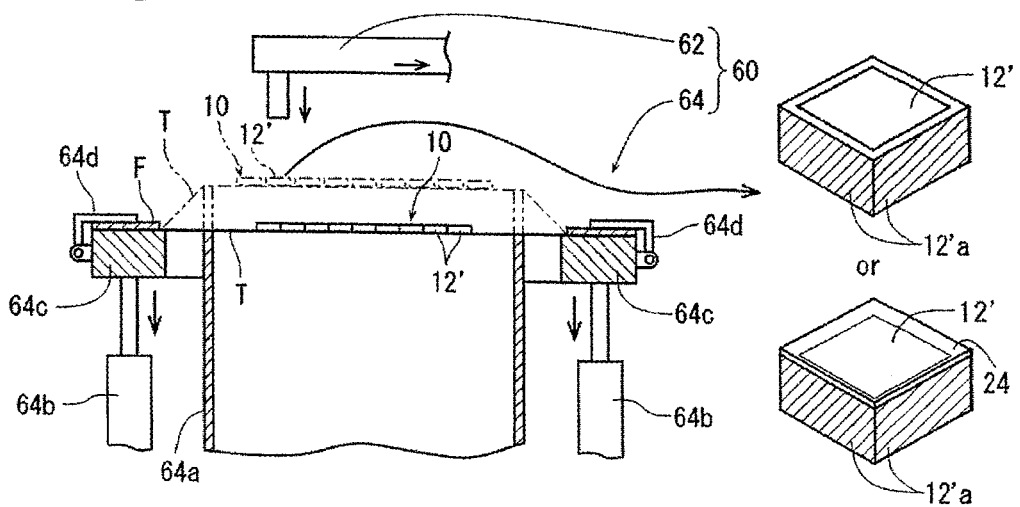
FIG. 8 is a partial sectional side view illustrating an execution form of a pick-up step.

After the dividing step and the modified layer removal step have been executed as described above, a pick-up step of picking up the device chips 12' from the dicing tape T as illustrated in FIG. 8 may be executed according to need. The pick-up step can be executed by using a pick-up apparatus 60 illustrated in FIG. 8, for example. The pick-up apparatus 60 includes a pick-up collet 62 that causes suction adhesion of the device chip 12' and conveys it and an expanding unit 64 that expands the dicing tape T to expand the interval between the adjacent device chips 12'.

As illustrated in FIG. 8, the expanding unit 64 includes a circular cylindrical expanding drum 64a, plural air cylinders 64b that are adjacent to the expanding drum 64a and extend upward at intervals in the circumferential direction, an annular holding member 64c joined to the upper end of each of the air cylinders 64b, and plural clamps 64d disposed at the outer circumferential edge part of the holding member 64c at intervals in the circumferential direction. The inner diameter of the expanding drum 64a is larger than the diameter of the wafer 10, and the outer diameter of the expanding drum 64a is smaller than the inner diameter Fa of the ring frame F. Further, the holding member 64c corresponds to the ring frame F, and the ring frame F is allowed to be placed on the flat upper surface of the holding member 64c.

As illustrated in FIG. 8, the plural air cylinders 64b raise and lower the holding member 64c relatively to the expanding drum 64a between a reference position (depicted by solid lines) at which the upper surface of the holding member 64c is at almost the same height as the upper end of the expanding drum 64a and an expanding position (depicted by two-dot chain lines) at which the upper surface of the holding member 64c is located on the lower side relative to the upper end of the expanding drum 64a.

The pick-up collet 62 illustrated in FIG. 8 is configured movably in the horizontal direction and the upward-downward direction. Further, suction means (diagrammatic representation is omitted) is connected to the pick-up collet 62, and suction adhesion of the device chip 12' is caused by the lower surface of the tip of the pick-up collet 62.

The description will be continued with reference to FIG. 8. In the pick-up step, first, the wafer 10 divided into the individual device chips 12' is oriented upward, and the ring frame F is placed on the upper surface of the holding member 64c located at the reference position. Subsequently, the ring frame F is fixed by the plural clamps 64d. Subsequently, the holding member 64c is lowered to the expanding position and thereby a radial tensile force acts on the dicing tape T. Thereupon, the interval between the device chips 12' stuck to the dicing tape T expands as depicted by the two-dot chain lines in FIG. 8.

Subsequently, the pick-up collet 62 is positioned above the device chip 12' of the pick-up target and is lowered, and suction adhesion of the upper surface of the device chip 12' is caused by the lower surface of the tip of the pick-up collet 62. Subsequently, the pick-up collet 62 is raised, and the device chip 12' is separated from the dicing tape T to be picked up (see the upper stage of the right side of FIG. 8). Subsequently, the picked-up device chip 12' is conveyed to a tray or the like that is not illustrated in the diagram, or is conveyed to a predetermined conveyance position of the next step. Then, such pick-up work is sequentially executed for all device chips 12', so that the pick-up step is completed. If the water-soluble resin removal step has been executed in advance as described above, the water-soluble resin 24 has been removed from the device chip 12' picked up in the pick-up step as depicted on the upper stage of the right side of FIG. 8. Thus, the device chip 12' can be conveyed to a bonding step as it is, and bonding processing can be executed.

In the above-described embodiment, the water-soluble resin removal step is executed before the pick-up step is executed. However, the present invention is not limited thereto. After the modified layer removal step by plasma etching is executed, the pick-up step may be executed without executing the water-soluble resin removal step, so that the device chip 12' may be picked up with the water-soluble resin 24 left on the front surface (see the lower stage of the right side of FIG. 8). In this case, in the next or subsequent step, the water-soluble resin removal step of removing the water-soluble resin 24 is executed immediately before the device chips 12' are wired to a substrate or the like, for example. This allows the front surfaces of the device chips 12' to be kept clean until immediately before the next step in the period from the pick-up step to the next step.

Figure 9:
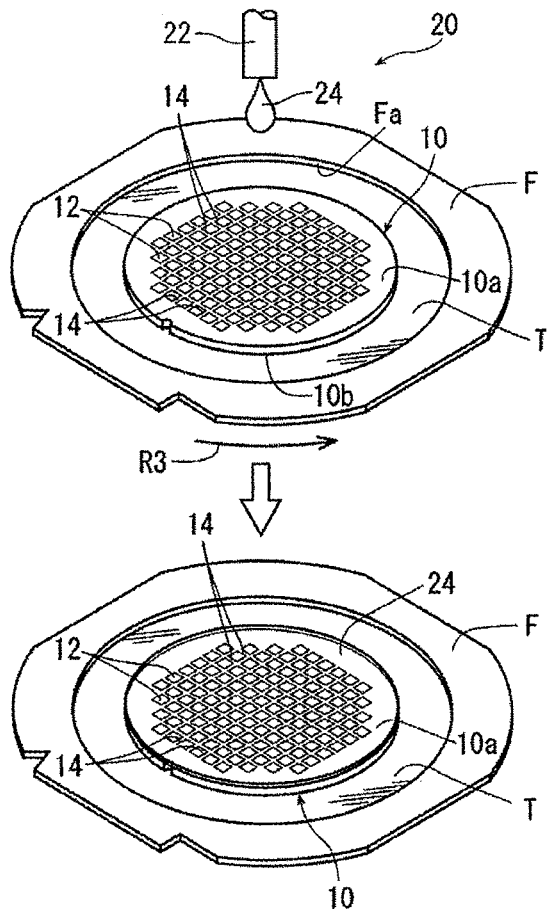
FIG. 9 is a perspective view illustrating another execution form of the water-soluble resin coating step.

In the above-described embodiment, the frame supporting step is executed after the modified layer forming step, and irradiation with the laser beam LB is executed from the back surface side of the wafer directly to form the modified layer 100 inside the planned dividing line 14 in this modified layer forming step. However, the frame supporting step may be executed before the modified layer forming step. In this case, for example, as illustrated in FIG. 9, the side of the front surface 10a of the wafer 10 is oriented upward, and the side of the back surface 10b is oriented downward and is stuck to the center of the dicing tape T. In addition, the outer circumference of the dicing tape T is supported by the ring frame F having the opening part Fa with a size that allows housing of the wafer 10 (frame supporting step). Subsequently, the front surface 10a of the wafer 10 is positioned directly under the nozzle 22 of the water-soluble resin coating apparatus 20. Then, the water-soluble resin 24 is supplied to the front surface 10a of the wafer 10 held by the ring frame F, and the ring frame F is rotated in a direction depicted by an arrow R3. Thereby, the front surface 10a can be evenly coated with the water-soluble resin 24 as depicted on the lower stage of FIG. 9.

Figure 10:
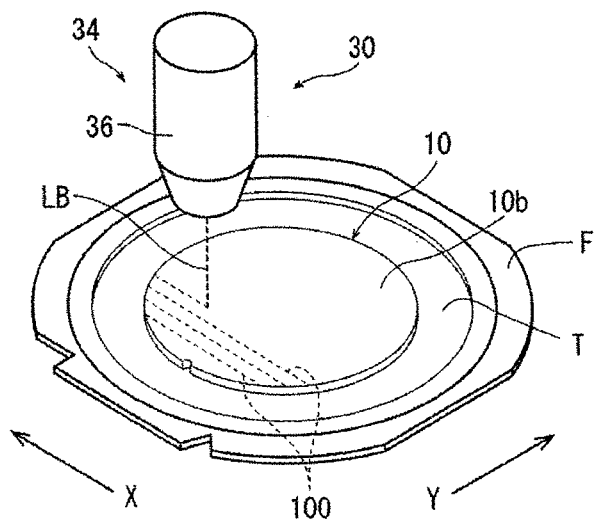
FIG. 10 is a perspective view illustrating another execution form of the modified layer forming step.

In the case in which the frame supporting step is executed before the modified layer forming step as described above, as illustrated in FIG. 10, the wafer 10 is conveyed to the laser processing apparatus 30, and a chuck table that is not illustrated in the diagram is caused to hold the wafer 10 in such a manner that the side of the back surface 10b of the wafer 10 supported by the ring frame F through the dicing tape T, i.e., the side of the dicing tape T, is oriented upward. Then, irradiation with the laser beam LB is executed from the side of the dicing tape T through the dicing tape T, so that the modified layers 100 can be formed inside all planned dividing lines 14 formed in the front surface 10a of the wafer 10, similarly to the process described based on FIG. 2.

In all of the above-described respective embodiments, the water-soluble resin coating step is executed before the modified layer forming step is executed. However, as described above, it suffices that the water-soluble resin coating step is executed before the dividing step, in which dust and so forth are scattered, is executed. Therefore, the water-soluble resin coating step may be executed after the modified layer forming step is executed and immediately before the dividing step is executed. In a case in which, after the modified layer forming step is executed, the water-soluble resin coating step is executed and the dividing step is executed, it is convenient that the water-soluble resin coating step is executed immediately before the dividing step is executed and the dividing step is executed before the water-soluble resin 24 with which the front surface 10a of the wafer 10 is coated solidifies. This can favorably divide the wafer 10 into the individual device chips 12' without heating and softening the water-soluble resin 24.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A processing method of a wafer for dividing, into individual device chips, the wafer on which a plurality of devices are formed on a front surface in such a manner as to be marked out by a plurality of planned dividing lines that intersect each other, the processing method comprising:
   a modified layer forming step of positioning a focal point of a laser beam with a wavelength having transmissibility with respect to the wafer to an inside of the planned dividing line and executing irradiation with the laser beam along the planned dividing line to form modified layers inside;
   a water-soluble resin coating step of coating the front surface of the wafer with a water-soluble resin, before or after the modified layer forming step;
   a frame supporting step of sticking a back surface of the wafer to a dicing tape and supporting an outer circumference of the dicing tape by a ring frame having an opening part that houses the wafer, before or after the modified layer forming step;

a dividing step of expanding the dicing tape to divide the wafer into the individual device chips together with the water-soluble resin with which the front surface of the wafer is coated, in the dividing step, one of (1) the dicing tape is expanded to divide the wafer into the individual device chips before the water-soluble resin solidifies, or (2) the water-soluble resin is heated and softened in a case in which the dicing tape is expanded to divide the wafer into the individual device chips after the water-soluble resin solidifies;

a modified layer removal step of executing plasma etching and removing the modified layers that remain at side surfaces of the device chips in a state in which the dicing tape is expanded and front surfaces of the individual device chips are coated with the water-soluble resin; and a water-soluble resin removal step of removing the water-soluble resin with which the front surfaces of the device chips are coated.

2. The processing method of a wafer according to claim 1, wherein
in a case in which the frame supporting step is executed after the modified layer forming step, irradiation with the laser beam is executed from a back surface side of the wafer to form the modified layers inside the planned dividing lines in the modified layer forming step.

3. The processing method of a wafer according to claim 1, wherein
in a case in which the frame supporting step is executed before the modified layer forming step, irradiation with the laser beam is executed from a side of the dicing tape through the dicing tape to form the modified layers inside the planned dividing lines in the modified layer forming step.

4. The processing method of a wafer according to claim 1, wherein the water-soluble resin coating step of coating the front surface of the wafer with the water-soluble resin applies the water-soluble resin to the device chips.

5. The processing method of a wafer according to claim 4, wherein when the water-soluble resin is heated and softened, a source of heat delivers heat within a circumference of the wafer to the water-soluble resin applied to the device chips.

6. A processing method of a wafer for dividing, into individual device chips, the wafer on which a plurality of devices are formed on a front surface in such a manner as to be marked out by a plurality of planned dividing lines that intersect each other, the processing method comprising:

a modified layer forming step of positioning a focal point of a laser beam with a wavelength having transmissibility with respect to the wafer to an inside of the planned dividing line and executing irradiation with the laser beam along the planned dividing line to form modified layers inside;

a water-soluble resin coating step of coating the front surface of the wafer with a water-soluble resin, before or after the modified layer forming step;

a frame supporting step of sticking a back surface of the wafer to a dicing tape and supporting an outer circumference of the dicing tape by a ring frame having an opening part that houses the wafer, before or after the modified layer forming step;

a dividing step of expanding the dicing tape to divide the wafer into the individual device chips together with the water-soluble resin with which the front surface of the wafer is coated, in the dividing step, the water-soluble resin is heated and softened in a case in which the dicing tape is expanded to divide the wafer into the individual device chips after the water-soluble resin solidifies;

a modified layer removal step of executing plasma etching and removing the modified layers that remain at side surfaces of the device chips in a state in which the dicing tape is expanded and front surfaces of the individual device chips are coated with the water-soluble resin; and a water-soluble resin removal step of removing the water-soluble resin with which the front surfaces of the device chips are coated.

7. The processing method of a wafer according to claim 6, wherein the water-soluble resin coating step of coating the front surface of the wafer with the water-soluble resin applies the water-soluble resin to the device chips, and a source of heat delivers heat within a circumference of the wafer to the water-soluble resin applied to the device chips.

8. The processing method of a wafer according to claim 7, the source of heat delivers heat directly to a front surface of the wafer on which the devices are formed.

9. The processing method of a wafer according to claim 6, a source of heat delivers heat directly to a front surface of the wafer on which the devices are formed heat and within a circumference of the wafer to the water-soluble resin applied to the device chips.

* * * * *